US011574822B2

(12) United States Patent
Unno et al.

(10) Patent No.: US 11,574,822 B2
(45) Date of Patent: Feb. 7, 2023

(54) WAFER SUPPORT TABLE WITH CERAMIC SUBSTRATE INCLUDING CORE AND SURFACE LAYER

(71) Applicant: NGK INSULATORS, LTD., Nagoya (JP)

(72) Inventors: Yutaka Unno, Handa (JP); Shuichiro Motoyama, Nagoya (JP)

(73) Assignee: NGK Insulators, LTD., Nagoya (JP)

( * ) Notice: Subject to any disclaimer, the term of this patent is extended or adjusted under 35 U.S.C. 154(b) by 441 days.

(21) Appl. No.: 16/693,855

(22) Filed: Nov. 25, 2019

(65) Prior Publication Data
US 2020/0090964 A1 Mar. 19, 2020

Related U.S. Application Data

(63) Continuation of application No. PCT/JP2019/011170, filed on Mar. 18, 2019.
(Continued)

(51) Int. Cl.
*H01L 21/67* (2006.01)
*H01J 37/32* (2006.01)
*H01L 21/683* (2006.01)

(52) U.S. Cl.
CPC .. *H01L 21/67103* (2013.01); *H01J 37/32724* (2013.01); *H01L 21/6833* (2013.01); *H01J 37/3255* (2013.01); *H01J 37/32541* (2013.01)

(58) Field of Classification Search
CPC ........... H01L 21/67103; H01L 21/6833; H01L 21/68735; H01L 21/68757;
(Continued)

(56) References Cited

U.S. PATENT DOCUMENTS 5,668,524 A   9/1997   Aida et al.
5,777,543 A   7/1998   Aida et al.
(Continued)

FOREIGN PATENT DOCUMENTS

EP   1 091 400 A1   4/2001
JP   H08-102485 A1   4/1996
(Continued)

OTHER PUBLICATIONS

International Search Report and Written Opinion (Application No. PCT/JP2019/011170) dated Jun. 18, 2019.
(Continued)

*Primary Examiner* — John P. Dulka
(74) *Attorney, Agent, or Firm* — Burr Patent Law, PLLC

(57) ABSTRACT

A ceramic heater includes a ceramic substrate including, on an upper surface, a wafer mount surface that receives a wafer, and a heater electrode embedded in an inside of the ceramic substrate. The ceramic substrate includes a core portion and a surface layer portion disposed on a surface of the core portion. The surface layer portion has volume resistivity higher than volume resistivity of the core portion. The core portion has thermal conductivity higher than thermal conductivity of the surface layer portion. The surface layer portion is disposed over an area of at least one of a side surface of the core portion and an upper surface of the core portion, the area being not covered with the wafer.

6 Claims, 5 Drawing Sheets

Related U.S. Application Data

(60) Provisional application No. 62/647,970, filed on Mar. 26, 2018.

(58) Field of Classification Search
CPC .......... H01L 21/68785; H01L 21/6831; H01L 21/6835; H01J 37/32724; H01J 37/32541; H01J 37/3255
See application file for complete search history.

(56) References Cited

U.S. PATENT DOCUMENTS

| | | | |
|---|---|---|---|
| 6,239,402 B1 * | 5/2001 | Araki | H01L 23/15 118/725 |
| 9,650,302 B2 | 5/2017 | Kimura et al. | |
| 2013/0229746 A1 * | 9/2013 | Aikawa | C04B 37/001 361/234 |
| 2014/0318575 A1 | 10/2014 | Parkhe | |
| 2020/0303205 A1 * | 9/2020 | Chae | C04B 35/645 |

FOREIGN PATENT DOCUMENTS

| | | |
|---|---|---|
| JP | H10-223742 A | 8/1998 |
| JP | H11-061448 A | 3/1999 |
| JP | 2000-044343 A | 2/2000 |
| JP | 2000-044345 A1 | 2/2000 |
| JP | 2000044343 A * | 2/2000 |
| JP | 2002-338365 A | 11/2002 |
| JP | 2003-313078 A1 | 11/2003 |
| JP | 5458050 B2 | 4/2014 |
| TW | 449845 B | 8/2001 |

OTHER PUBLICATIONS

Japanese Office Action (Application No. 2019-539866) dated Nov. 30, 2021 (with English translation).

English translation of International Preliminary Report on Patentability (Chapter I) (Application No. PCT/JP2019/011170) dated Oct. 8, 2020, 7 pages.

Taiwanese Office Action, Taiwanese Application No. 108109518, dated Nov. 25, 2022 (5 pages).

* cited by examiner

WAFER SUPPORT TABLE WITH CERAMIC SUBSTRATE INCLUDING CORE AND SURFACE LAYER

BACKGROUND OF THE INVENTION

1. Field of the Invention

The present invention relates to a wafer support table.

2. Description of the Related Art

A wafer support table that supports a wafer that is to be subjected to a plasma treatment is known as a component for a semiconductor manufacturing device. Such a known wafer support table includes a ceramic substrate that includes, on an upper surface, a wafer mount portion that receives a wafer, and a heater electrode that is embedded in an inside of the ceramic substrate. A preferable example known as the material of the ceramic substrate is a sintered aluminium nitride having high thermal conductivity and high corrosion resistance. A sintered aluminium nitride, however, significantly degrades its volume resistivity in a high-temperature range. Thus, the current that leaks from the heater electrode increases, and may hinder wafer processing. In view of this point, PTL 1 uses a sintered aluminium nitride with an average grain diameter of smaller than or equal to 4 µm to which 0.3 to 10 percent by mass of an yttrium oxide is added so that the material keeps high volume resistivity also in the high-temperature range.

CITATION LIST

Patent Literature

PTL 1: JP 2003-313078 A

SUMMARY OF THE INVENTION

However, a ceramic substrate according to PTL 1 has no highly resistive layer on its side surface, so that an electrode is coupled with plasma. Although the material can keep high volume resistivity in the high-temperature range, the material has low thermal conductivity, and may fail to uniformly heat the wafer.

The present invention is made to address the above problem, and mainly aims to prevent a heater electrode and plasma from being coupled together and to improve the uniformity in heating a wafer.

The present invention provides a wafer support table that includes a ceramic substrate including, on an upper surface, a wafer mount portion that receives a wafer; and a heater electrode embedded in an inside of the ceramic substrate.

The ceramic substrate includes a core portion and a surface layer portion disposed on a surface of the core portion.

The surface layer portion has volume resistivity higher than volume resistivity of the core portion.

The core portion has thermal conductivity higher than thermal conductivity of the surface layer portion.

The surface layer portion is disposed over an area of at least one of a side surface of the core portion and the upper surface of the core portion, the area being not covered with the wafer.

In this wafer support table, the ceramic substrate includes a core portion and a surface layer portion disposed on the surface of the core portion. The surface layer portion is disposed over an area of at least one of the side surface of the core portion and the upper surface of the core portion, the area being not covered with the wafer. Here, the surface layer portion has volume resistivity higher than volume resistivity of the core portion. This structure can prevent, when a plasma treatment is performed on the wafer, coupling of the heater electrode and plasma, which may hinder the plasma treatment on the wafer. The core portion has thermal conductivity higher than thermal conductivity of the surface layer portion. Thus, the ceramic substrate has relatively high thermal conductivity as a whole, and improves the performance of uniformly heating the wafer.

In the present specification, "upward" and "downward" are used to refer to a relative positional relationship instead of an absolute positional relationship between each other. Thus, depending on the orientation of the ceramic heater, "upward" and "downward" may be changed to "leftward" and "rightward", "frontward" and "rearward", or "downward" and "upward".

In the wafer support table according to the present invention, the surface layer portion may be further disposed on an undersurface of the core portion. This structure can further prevent plasma coupling from occurring through the undersurface of the ceramic substrate.

In the wafer support table according to the present invention, the surface layer portion may be further disposed on an area of the upper surface of the core portion that is covered with the wafer. Specifically, the surface layer portion may be disposed throughout the upper surface of the core portion. This structure can prevent current from leaking from the heater electrode to the wafer.

In the wafer support table according to the present invention, the surface layer portion may be disposed to surround all the surfaces of the core portion. This structure can further prevent the heater electrode and plasma from being coupled together and current from leaking from the heater electrode.

In the wafer support table according to the present invention, at least one of an electrostatic electrode and a RF electrode may be embedded in an inside of the ceramic substrate to serve as an electrode other than the heater electrode. When the electrostatic electrode or the RF electrode is embedded in an inside of the ceramic substrate, current may leak from the electrode. However, in the wafer support table according to the present invention, such leak current can be reduced.

In the above wafer support table, the electrode other than the heater electrode may be embedded between the upper surface of the ceramic substrate and the heater electrode. This structure has a small gap between the electrode other than the heater electrode and the upper surface of the ceramic substrate, and is more likely to cause leak current. Thus, an application of the present invention is significant.

In the wafer support table according to the present invention, the core portion and the surface layer portion preferably contain an aluminium nitride as a main component. This is because an aluminium nitride has high thermal conductivity and high corrosion resistance.

To manufacture a ceramic substrate constituting a wafer support table according to the present invention, for example, (1) a powder material for the core portion may be shaped and then fired to manufacture the core portion, and then a powder material for the surface layer portion may be fed to a predetermined surface of the core portion, shaped, and fired, or (2) a compact of a powder material for the core portion, and a compact of a powder material for the surface layer portion may be separately formed by mold casting, and they may be integrated together and then fired.

DETAILED DESCRIPTION OF THE INVENTION

Figure 1:
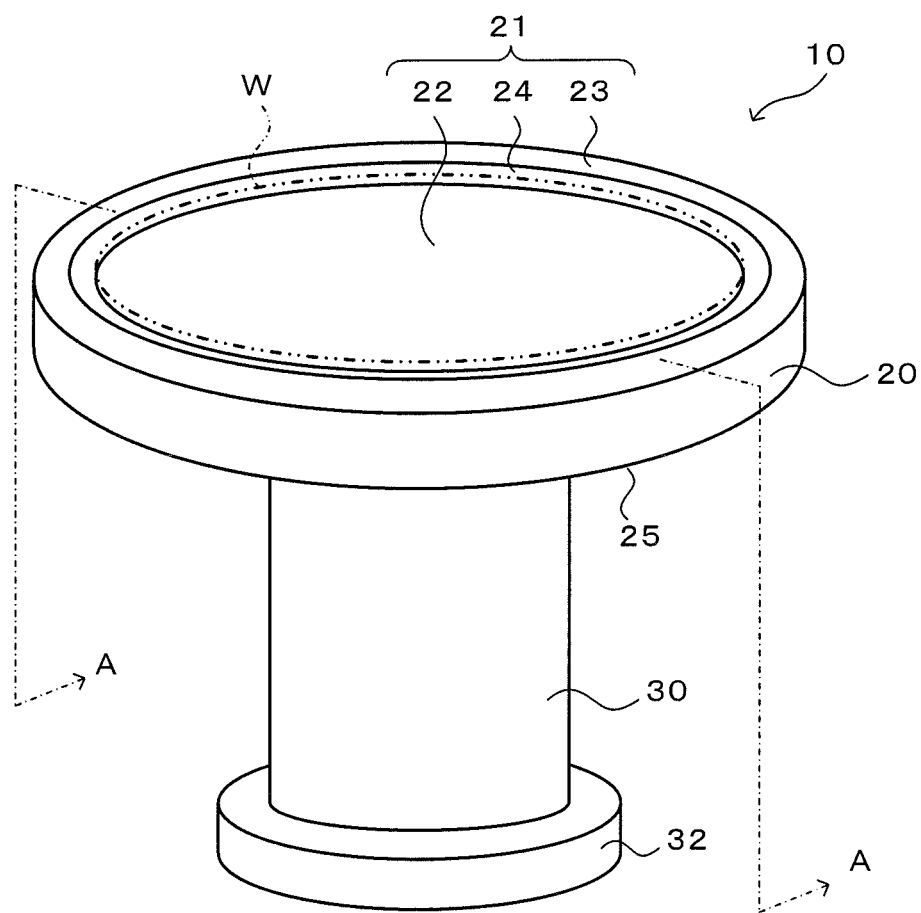
FIG. 1 is a perspective view of a ceramic heater 10.

Preferable embodiments of the present invention will be described below with reference to the drawings. FIG. 1 is a perspective view of a ceramic heater 10, FIG. 2 is a cross-sectional view of the ceramic heater 10 in FIG. 1 taken along line A-A, and FIGS. 3A to 3D are manufacturing processes of a ceramic substrate 20.

The ceramic heater 10 is an example of a wafer mount table of the present invention, and includes a ceramic substrate 20 and a hollow cylindrical shaft 30.

The ceramic substrate 20 includes, on an upper surface 21, a wafer mount surface 22 that receives a wafer W. The ceramic substrate 20 has a diameter of, for example, approximately 300 mm, and a thickness of, for example, approximately 20 mm. The wafer mount surface 22 is a recessed portion disposed at the center of the upper surface 21 of the ceramic substrate 20. The upper surface 21 has an annular surface 23, which surrounds the wafer mount surface 22 at a position higher than the wafer mount surface 22. A bank 24, which is a slope, is disposed between the wafer mount surface 22 and the annular surface 23. Specifically, the upper surface 21 includes the wafer mount surface 22, the annular surface 23, and the bank 24.

Figure 2:
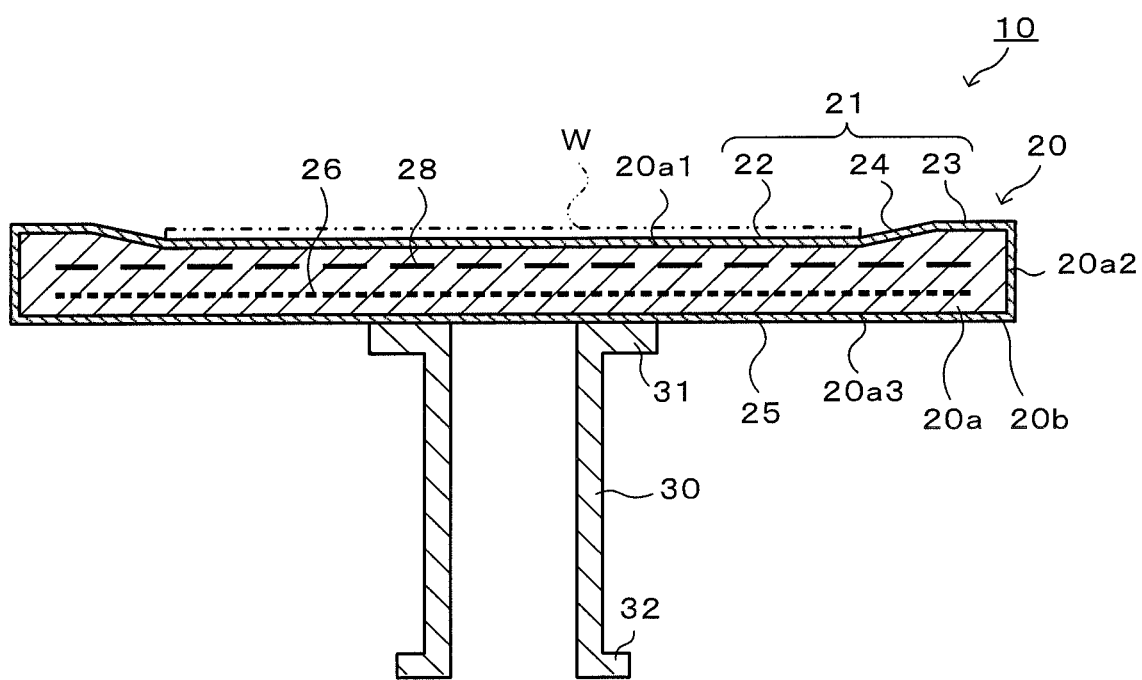
FIG. 2 is a cross-sectional view of the ceramic heater 10 illustrated in FIG. 1 taken along line A-A.
Figure 3A:
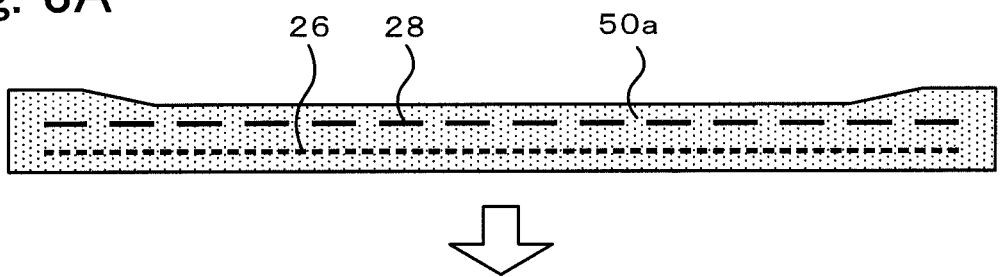
FIGS. 3A to 3D illustrate manufacturing processes of a ceramic substrate 20.
Figure 3B:
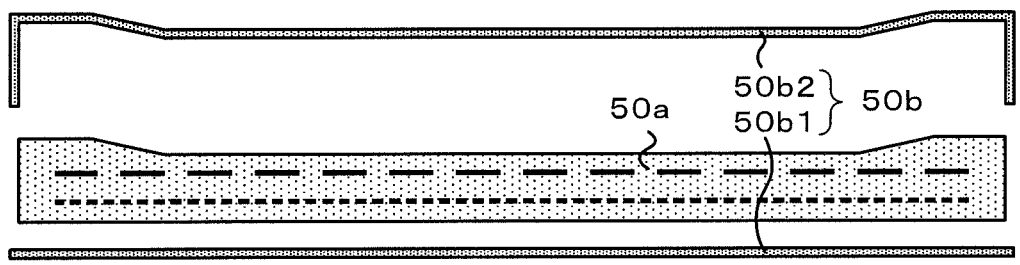
Figure 3C:
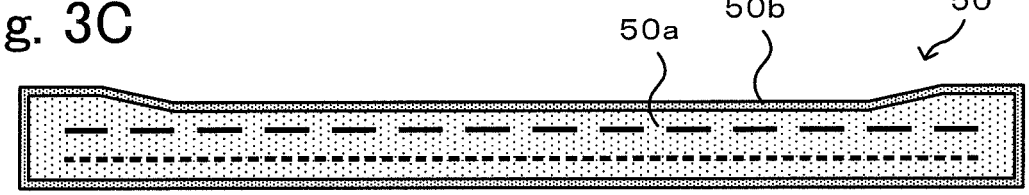
Figure 3D:
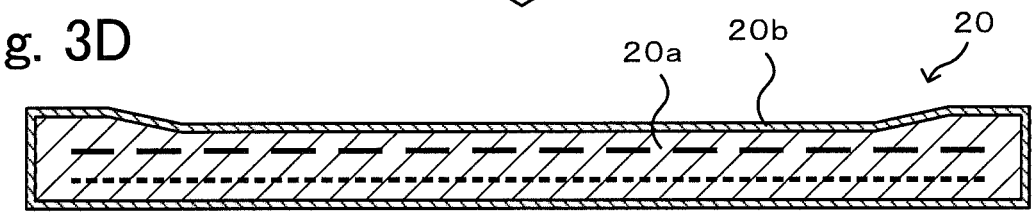

As illustrated in FIG. 2, the ceramic substrate 20 includes a core portion 20a, which has substantially the same shape as the ceramic substrate 20, and a surface layer portion 20b, disposed on the surface of the ceramic substrate 20. The core portion 20a forms a center of the ceramic substrate 20. The surface layer portion 20b surrounds all the surfaces of the core portion 20a, that is, an upper surface 20a1, a side surface 20a2, and an undersurface 20a3 of the core portion 20a. The surface layer portion 20b has volume resistivity higher than the volume resistivity of the core portion 20a. The core portion 20a has thermal conductivity higher than the thermal conductivity of the surface layer portion 20b. The core portion 20a and the surface layer portion 20b contain an aluminium nitride as a main component. Examples of the material for the core portion 20a having low volume resistivity and high thermal conductivity include a sintered aluminium nitride having a large grain diameter. Examples of the material for the surface layer portion 20b having high volume resistivity and low thermal conductivity include a sintered aluminium nitride having a small grain diameter. Table 1 shows examples of the materials of the core portion 20a and the surface layer portion 20b. Although not limited to particular ones, the surface layer portion 20b may have a thickness of, for example, 1 to 5 mm.

TABLE 1

| Item | Ceramic Substrate | |
|---|---|---|
| | Core Portion | Surface Layer Portion |
| Grain Diameter [μm] | 4-5 | 1-2 |
| Thermal Conductivity [W/mK][X1] | 170 | 90 |
| Volume Resistivity [Ωcm][X2] | 5.0E+13 | 1.0E+16 |
| Main Component | AlN | AlN |
| Metal Component[X3] | N/A | Ti(<1 wt %), Mg(<1 wt %) |

[X1] Measured at room temperature
[X2] Measured at room temperature
[X3] Metal component of metal oxide added to a material before firing A heater electrode 26 and an RF electrode 28 are embedded in the core portion 20a of the ceramic substrate 20. The heater electrode 26 is a coil whose main component is Mo and that is unicursaly wired throughout the entire surface of the ceramic substrate 20. Both ends of the heater electrode 26 are connected to a power feeding member (not illustrated). The power feeding member extends through the hollow space inside the hollow cylindrical shaft 30 to be connected to an external power source (not illustrated). The RF electrode 28 is a disc-shaped thin layer electrode having a diameter slightly smaller than the ceramic substrate 20, and is a mesh sheet formed by weaving thin metal wires containing Mo as a main component. The RF electrode 28 is embedded in an inside of the ceramic substrate 20 between the heater electrode 26 and the wafer mount surface 22. The heater electrode 26 and the RF electrode 28 are made of Mo, because Mo has a coefficient of thermal expansion closer to that of an aluminium nitride forming the ceramic substrate 20, and is less likely to be cracked during manufacturing of the ceramic substrate 20 or with repetition of a heat cycle. Power feeding members (not illustrated) are connected to a portion near the center of the RF electrode 28. The RF electrode 28 is used to cause plasma.

The hollow cylindrical shaft 30 is a ceramic cylindrical member containing an aluminium nitride as a main component. The hollow cylindrical shaft 30 has a first flange 31 around an upper opening, and a second flange 32 around a lower opening. The end surface of the first flange 31 is bonded to an undersurface 25 of the ceramic substrate 20 by solid-state welding or diffusion welding.

Subsequently, an application example of the ceramic heater 10 will be described. The ceramic heater 10 is disposed in a chamber, not illustrated, and the wafer W is mounted on the wafer mount surface 22. Then, an alternating-current high-frequency voltage is applied to the RF electrode 28 to cause plasma between parallel-plate electrodes, which include a parallel-opposed electrode, which is disposed at an upper portion in the chamber and not illustrated, and a RF electrode 28 embedded in the inside of the ceramic substrate 20. The plasma is used to perform chemical vapor deposition (CVD) or etching on the wafer W. In addition, the temperature of the wafer W is measured based on a detection signal of a thermocouple, not illustrated, and the voltage applied to the heater electrode 26 is controlled to bring the temperature to a predetermined temperature.

Subsequently, an example for manufacturing a ceramic substrate 20 constituting the ceramic heater 10 will be described. FIGS. 3A to 3D illustrate manufacturing processes of the ceramic substrate 20. Firstly, a first compact 50a for manufacturing the core portion 20a of the ceramic substrate 20 is formed by mold casting (refer to FIG. 3A).

The first compact 50a has the heater electrode 26 and the RF electrode 28 incorporated therein. The first compact 50a is formed by aluminium nitride powder not containing additives such as titania or magnesia. Mold casting is a known method also referred to as gel casting, and disclosed in detail in, for example, Japanese Patent No. 5458050. Japanese Patent No. 5458050 describes a method for manufacturing a ceramic compact in which two layers of electrodes are embedded. In accordance with this method, the first compact 50a is formed and degreased. Subsequently, a lower half 50b1 and an upper half 50b2 of a second compact 50b for forming the surface layer portion 20b of the ceramic substrate 20 are formed by mold casting, and degreased (refer to FIG. 3B). Aluminium nitride powder to which a small amount (for example, smaller than or equal to 1% by mass) of an additive such as titania or magnesia is added is used to form these halves 50b1 and 50b2. Subsequently, these halves 50b1 and 50b2 and the first compact 50a are integrated into an integrated compact 50 (refer to FIG. 3C). This integrated compact 50 is fired by hot pressing, so that the first compact 50a becomes a core portion 20a, and the second compact 50b becomes a surface layer portion 20b, to obtain the ceramic substrate 20 (refer to FIG. 3D). The core portion 20a is a sintered compact of aluminium nitride powder not containing an additive, whereas the surface layer portion 20b is a sintered compact of aluminium nitride powder containing titania or magnesia, which hinders grain growth. Thus, a sintered aluminium nitride of the surface layer portion 20b has a smaller grain diameter than a sintered aluminium nitride of the core portion 20a. A sintered aluminium nitride with a smaller grain diameter has higher volume resistivity and lower thermal conductivity. Thus, the surface layer portion 20b has higher volume resistivity than the core portion 20a, and the core portion 20a has higher thermal conductivity than the surface layer portion 20b.

In the ceramic heater 10 described above in detail, the surface layer portion 20b having higher volume resistivity is disposed over the upper surface 20a1, the side surface 20a2, and the undersurface 20a3 of the core portion 20a having lower volume resistivity. Specifically, the surface layer portion 20b is disposed to surround all the surfaces of the core portion 20a. This structure can thus prevent, when a wafer W is subjected to a plasma treatment, coupling between the heater electrode 26 and plasma, which may hinder a plasma treatment on the wafer W. On the other hand, the core portion 20a at the center of the ceramic substrate 20 has higher thermal conductivity than the surface layer portion 20b of the ceramic substrate 20. Thus, the ceramic substrate 20 has relatively high thermal conductivity as a whole, and thus improves the performance of uniformly heating the wafer W.

Particularly, the surface layer portion 20b is disposed over the entirety of the upper surface 21 of the ceramic substrate 20. Specifically, the surface layer portion 20b is disposed on the upper surface 21 of the ceramic substrate 20 over an area covered with the wafer W (the wafer mount surface 22), besides the area not covered with the wafer W (the annular surface 23 and the bank 24). This structure can thus reduce leak current from the heater electrode 26 or the RF electrode 28 to the wafer W. The surface layer portion 20b is also disposed over the entirety of the undersurface 25 of the ceramic substrate 20. This structure can thus prevent plasma coupling from occurring through the undersurface of the ceramic substrate 20.

The RF electrode 28 is embedded between the heater electrode 26 and the upper surface 21 of the ceramic substrate 20. Thus, the distance between the RF electrode 28 and the wafer mount surface 22 of the ceramic substrate 20 (that is, the thickness of a dielectric layer) is reduced. A high voltage is applied to the RF electrode 28. Thus, leak current is more likely to occur as the dielectric layer has a smaller thickness. Thus, an application of the present invention is significant.

The core portion 20a and the surface layer portion 20b of the ceramic substrate 20 contain an aluminium nitride as a main component, and thus have high thermal conductivity and high corrosion resistance.

The present invention is not limited to any of the above embodiments, and may naturally be embodied in various manners within the technical scope of the present invention.

Figure 4:
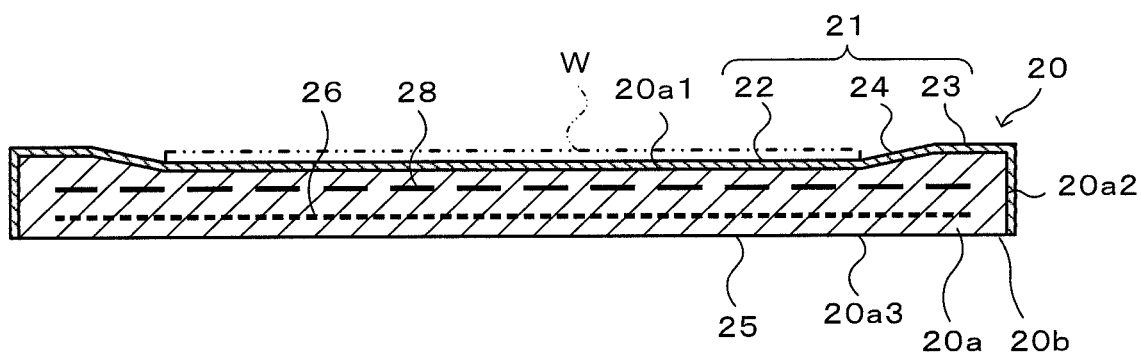
FIG. 4 is a cross-sectional view of another example of the ceramic substrate 20.
Figure 5:
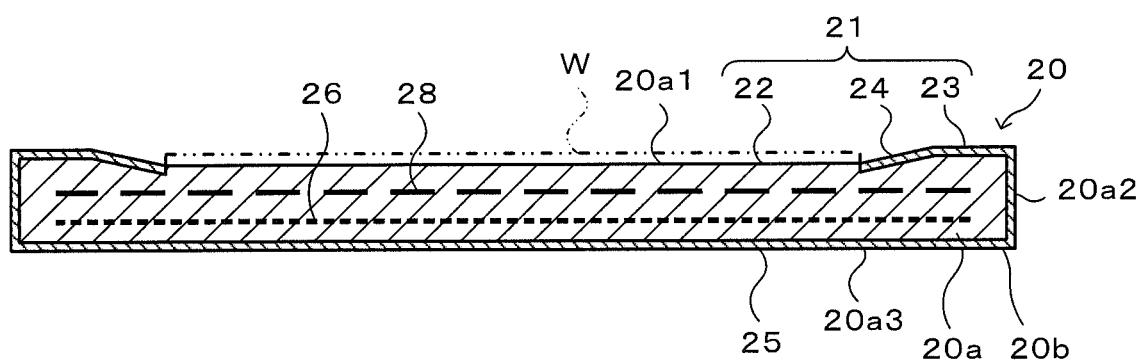
FIG. 5 is a cross-sectional view of another example of the ceramic substrate 20.

For example, in the above embodiments, the surface layer portion 20b having high volume resistivity and low thermal conductivity is disposed over the upper surface 20a1, the side surface 20a2, and the undersurface 20a3 of the core portion 20a of the ceramic substrate 20. However, as illustrated in FIG. 4, the surface layer portion 20b may not be disposed over the undersurface 20a3 of the core portion 20a. This is because the heater electrode 26 and plasma are relatively less likely to be coupled together through the undersurface 20a3. Alternatively, as illustrated in FIG. 5, the surface layer portion 20b may be disposed over the area of the upper surface 20a1 not covered with the wafer W (the annular surface 23 and the bank 24), but not be disposed over the area of the upper surface 20a1 covered with the wafer W (the wafer mount surface 22). This is because the wafer mount surface 22 covered with the wafer W is not exposed to plasma while the wafer W is subjected to a plasma treatment. The wafer mount surface 22 illustrated in FIG. 5 is located slightly higher than the inner circumferential edge of the bank 24. In FIG. 4 and FIG. 5, components the same as those of the embodiment are denoted with the same reference signs. In FIG. 5, the surface layer portion 20b may not be disposed over the undersurface 20a3 of the core portion 20a, as in FIG. 4.

Figure 6:
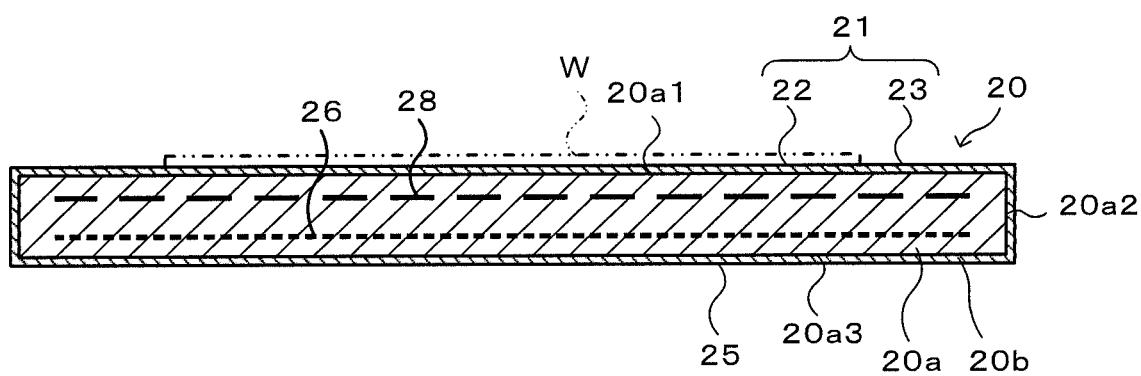
FIG. 6 is a cross-sectional view of another example of the ceramic substrate 20.
Figure 7:
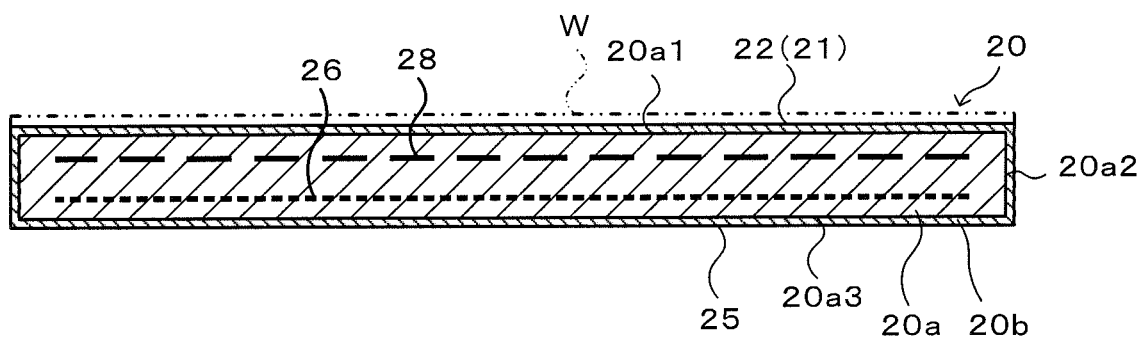
FIG. 7 is a cross-sectional view of another example of the ceramic substrate 20.

In the above embodiment, the recessed portion at the center of the upper surface 21 of the ceramic substrate 20 is defined as the wafer mount surface 22. However, as illustrated in FIG. 6, the wafer mount surface 22 and the annular surface 23 may be on the same plane without providing a recessed portion on the upper surface 21. Alternatively, as illustrated in FIG. 7, the wafer mount surface 22 may be disposed over the entirety of the upper surface 21 without providing a recessed portion on the upper surface 21. In FIG. 6 and FIG. 7, components the same as those of the above embodiment are denoted with the same reference signs.

In the above embodiment, the RF electrode 28 is embedded in the core portion 20a of the ceramic substrate 20, but the RF electrode 28 may be omitted, or an electrostatic electrode may be embedded in the core portion 20a instead of or in addition to the RF electrode 28. In a structure in which an electrostatic electrode is embedded, when a voltage is applied to the electrostatic electrode after a wafer W is mounted on the wafer mount surface 22, the wafer W can be electrostatically attracted to the wafer mount surface 22. The electrostatic electrode may be embedded between the wafer mount surface 22 and the heater electrode 26.

In the above embodiment, the hollow cylindrical shaft 30 with a straight shape is illustrated by way of example, but the shape of the hollow cylindrical shaft 30 is not particularly limited to the straight shape. For example, the hollow cylindrical shaft may have a straight portion from the lower end to a predetermined height, and an enlarged tube portion from the predetermined height to the upper end, having a diameter larger than the diameter of the straight portion. The enlarged tube portion may have a diameter that partially or entirely increases toward the upper end.

In the above embodiment, the heater electrode 26 is unicursaly wired throughout the ceramic substrate 20, but may be disposed on each of zones into which the ceramic substrate 20 is divided.

In the above embodiment, the core portion 20a and the surface layer portion 20b of the ceramic substrate 20 are made of ceramic containing an aluminium nitride as a main component. However, the main component may be, for example, alumina, a silicon nitride, a silicon carbide, or cordierite, instead of an aluminium nitride.

In the above embodiment, a coil is used as the heater electrode 26, but a ribbon (flat shape) may be used instead of a coil. When a ribbon is used as the heater electrode 26, the heater electrode 26 can be manufactured by performing printing with metal paste (such as Mo paste).

In the above embodiment, the heater electrode 26 and the RF electrode 28 are manufactured with a material containing Mo as a main component. However, the material is not particularly limited to this, and may be another material containing another refractory metal (such as W) as a main component.

The present application is a Continuation Application of PCT/JP2019/011170, filed Mar. 18, 2019, and claims the benefit of U.S. Patent Application No. 62/647,970 filed on Mar. 26, 2018.

What is claimed is:

1. A wafer support table, comprising:
   a ceramic substrate including, on an upper surface, a wafer mount portion that receives a wafer; and
   a heater electrode embedded in an inside of the ceramic substrate, wherein
   the ceramic substrate includes a core portion and a surface layer portion disposed on a surface of the core portion,
   the surface layer portion has volume resistivity higher than volume resistivity of the core portion,
   the core portion has thermal conductivity higher than thermal conductivity of the surface layer portion,
   the surface layer portion is disposed over at least one of a side surface of the core portion and an upper surface of the core portion that is not covered with the wafer, and
   the core portion is formed of a sintered aluminum nitride, which has a grain diameter, and the surface layer portion is formed of a sintered aluminum nitride containing Ti, which has a grain diameter, such that the grain diameter of the sintered aluminum nitride containing Ti of the surface layer portion is smaller than the grain diameter of the sintered aluminum nitride of the core portion.

2. The wafer support table according to claim 1, wherein the surface layer portion is further disposed over an undersurface of the core portion.

3. The wafer support table according to claim 1, wherein the surface layer portion is further disposed over an upper surface of the core portion that is covered with the wafer.

4. The wafer support table according to claim 1, wherein the surface layer portion is disposed to surround all the surfaces of the core portion.

5. The wafer support table according to claim 1, wherein at least one of an electrostatic electrode and a RF electrode is embedded in the inside of the ceramic substrate to serve as an electrode other than the heater electrode.

6. The wafer support table according to claim 5, wherein the electrode other than the heater electrode is embedded between the upper surface of the ceramic substrate and the heater electrode.

* * * * *